United States Patent [19]
Hamaguchi

[11] Patent Number: 5,939,734
[45] Date of Patent: Aug. 17, 1999

[54] SEMICONDUCTOR LIGHT EMITTING DEVICE AND METHOD OF FABRICATING THE SAME

[75] Inventor: Yuichi Hamaguchi, Tokyo, Japan

[73] Assignee: Sony Corporation, Japan

[21] Appl. No.: 09/026,895

[22] Filed: Feb. 20, 1998

[30] Foreign Application Priority Data

Feb. 21, 1997 [JP] Japan .................................. 9-037928

[51] Int. Cl.[6] .................................................. H01L 33/00
[52] U.S. Cl. .......................... 257/94; 257/95; 257/96; 257/97; 257/622; 257/627; 257/628; 372/45; 372/46; 372/48; 438/44
[58] Field of Search .............................. 257/94, 95, 96, 257/97, 627, 628, 622; 372/48, 45, 46; 438/44

[56] References Cited

U.S. PATENT DOCUMENTS

| | | | |
|---|---|---|---|
| 4,404,678 | 9/1983 | Aiki et al. .................................. | 372/45 |
| 4,835,578 | 5/1989 | Ohtoshi et al. ........................... | 357/17 |
| 4,946,802 | 8/1990 | Shima et al. ........................... | 372/46 X |
| 5,037,776 | 8/1991 | Galeuchet et al. ...................... | 437/129 |
| 5,291,033 | 3/1994 | Morishima ............................. | 257/95 X |
| 5,514,619 | 5/1996 | Wakabayashi et al. .................. | 437/89 |

FOREIGN PATENT DOCUMENTS

| | | |
|---|---|---|
| 55-123189 | 9/1980 | Japan . |
| 58-164283 | 9/1983 | Japan . |

*Primary Examiner*—William Mintel
*Attorney, Agent, or Firm*—Rader, Fishman & Grauer; Ronald P. Kananen

[57] ABSTRACT

A method of fabricating a semiconductor light emitting device includes fabricating, semiconductor light emitting devices on a large scale by forming desirable end surfaces of resonators using an etching process. The method includes the steps of forming, on a base body, semiconductor layers for constituting a plurality of semiconductor light emitting devices; grooving the semiconductor layers formed on the base body in the direction from a front surface of the semiconductor layers to the base body, to form stripe-like grooves; and forming a semiconductor film in the grooves by epitaxial growth; wherein a side surface of each of the grooves, which side surface finally forms an end surface of a resonator of each of the semiconductor light emitting devices, is a crystal plane being later in epitaxial growth rate than a bottom surface of the groove.

6 Claims, 4 Drawing Sheets

SEMICONDUCTOR LIGHT EMITTING DEVICE AND METHOD OF FABRICATING THE SAME

BACKGROUND OF THE INVENTION

The present invention relates to a semiconductor light emitting device, for example, a semiconductor laser, and a method of fabricating the same.

In a semiconductor light emitting device, for example, a semiconductor laser, it is desired that a light emitting end surface of the device, that is, an end surface of an optical resonator, is composed of an optical mirror surface. In general, such an end surface of an optical resonator is formed of a cleavage crystal plane. In the case where an end surface of an optical resonator is formed of a cleavage crystal plane, generally, a semiconductor substrate is first prepared in which a plurality of stripe-like resonators each being equivalent to several semiconductor light emitting devices are formed in parallel to each other. Then, the semiconductor substrate is cleaved along planes crossing the lengthwise direction of the stripe-like optical resonators into a plurality of semiconductor bars each having a width corresponding to a length of a resonator of a semiconductor laser chip to be finally obtained, wherein the cleavage surface is taken as the end surface of the resonator of the semiconductor device finally obtained. A protective film or an optical film having a specific reflectance is formed on each side surface of the semiconductor bar, wherein end side surface constitutes an end surface of the resonator. Then, the semiconductor bar is cut along lines between respective stripes to form semiconductor laser chips.

The above method, however, has a problem that since the worker must handle a plurality of semiconductor bars after one semiconductor substrate is divided into multiple semiconductor bars, the handling thereof is laborious, resulting in degraded productivity on a large scale.

On the other hand, a method in which an end surface of a resonator is formed via an etched surface has been proposed. This method does not require additional work for forming end surfaces of resonators by the above cleavage, that is, additional work for preparing semiconductor bars. As a result, according to this method, the worker can handle a semiconductor substrate equivalent to several semiconductor lasers as it is substantially up to the sizing step for forming semiconductor laser chips, to thereby increase productivity on a large scale.

In the method using etching, however, there occurs a problem that the etched surface is not necessarily smooth and accordingly, in a semiconductor laser finally obtained, a so-called "facet degradation" is increased, to thus reduce luminous efficiency and lower service life.

SUMMARY OF THE INVENTION

An object of the present invention is to provide a semiconductor light emitting device such as a semiconductor laser suitable for mass-production, in which a desirable end surface of a resonator of the device is formed using an etching process, and a method of fabricating the semiconductor light emitting device.

To achieve the above object, according to a first aspect of the present invention, there is provided a semiconductor light emitting device, including: semiconductor layers, formed on a base body, for constructing a plurality of semiconductor light emitting devices; stripe-like grooves formed in the semiconductor layers formed on the base body in the direction from a front surface of the semiconductor layers to the base body; and a semiconductor film formed in the grooves by epitaxial growth; wherein a side surface of each of the grooves, which side surface finally forms an end surface of a resonator of each of the semiconductor light emitting devices, is a crystal plane being later in expitaxial growth rate than a bottom surface of the groove.

According to a second aspect of the present invention, there is provided a method of fabricating a semiconductor light emitting device, including the steps of: forming, on a base body, semiconductor layers for constructing a plurality of semiconductor light emitting devices; grooving the semiconductor layers formed on the base body in a selected direction from a front surface of the semiconductor layers to the base body, to form stripe-like grooves; and forming a semiconductor film in the grooves by epitaxial growth; wherein a side surface of each of the grooves, which side surface finally forms an end surface of a resonator of each of the semiconductor light emitting devices, is a crystal plane having a lower epitaxial growth rate than a bottom surface of the groove.

According to the present invention, the surfaces of resonators of semiconductor light emitting devices finally obtained are formed by grooving a semiconductor substrate having semiconductor layers constituting a plurality of semiconductor light emitting devices. As; a result, the method of the present invention makes it possible to simply fabricate a semiconductor light emitting device.

Further, according to the present; invention, by epitaxial growth of a semiconductor film in each groove, a flat surface having excellent smoothness is formed on a side surface of the groove. The reason for this is as follows. Namely, according to the present invention, the side surface of the groove is basically formed of a plane having a lower epitaxial growth rate (hereinafter, such a plane is referred to simply as a specific crystal plane). When a semiconductor film is formed on each side surface of the groove by epitaxial growth, even if the side surface does not become smooth and contains a different crystal plane in addition to the specific crystal plane, the epitaxial growth proceeds for the different crystal plane. And, if the epitaxial growth involves generation of the specific crystal plane, the epitaxial growth is apparently stopped at the specific crystal plane. As a result, since the end surface of the resonator is formed of only the specific crystal plane, the end surface is formed as a very smooth plane at an atomic level. This makes it possible to reduce the facet degradation, to improve luminous efficiency and stability, and to increase service life.

DETAILED DESCRIPTION OF THE PREFERRED EMBODIMENT

Hereinafter, a preferred embodiment will be described with reference to the drawings.

Figure 1A:
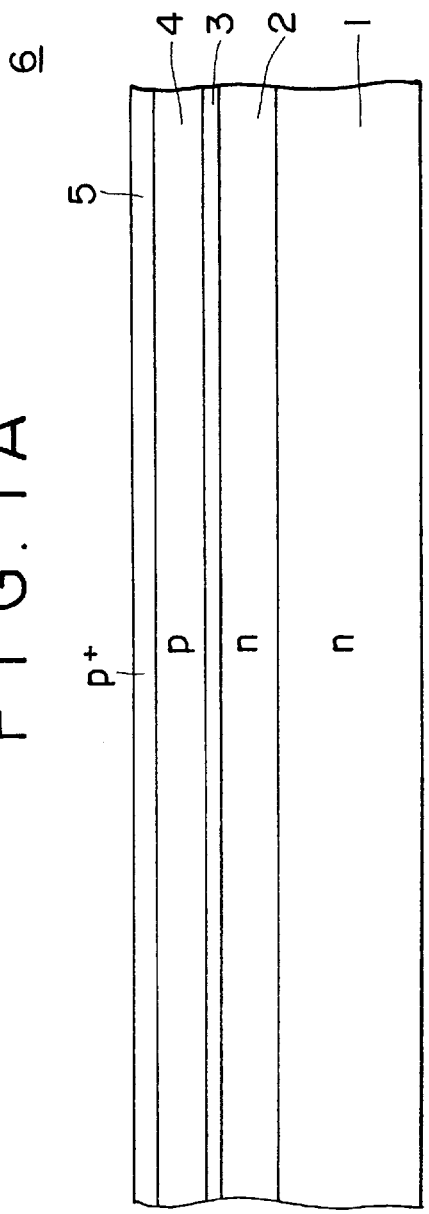
FIGS. 1A and 1B are schematic sectional views illustrating steps for fabricating a semiconductor light emitting device according to one embodiment of the present invention.

In this embodiment, the present invention is applied to an AlGaAs based semiconductor laser. First, as shown in FIG. 1A, a wafer-shaped semiconductor base body 1 made from GaAs of a first conducting type (for example, n-type) is prepared. Next, a first clad layer 2 made from $Al_xGa_{1-x}As$ of the first conducting type (n-type), an active layer 3 made from $Al_yGa_{1-y}As$ ($0 \leq y < x$), a second clad layer 4 made from $Al_xGa_{1-x}As$ of a second conducting type (for example, p-type), and a cap layer 5 made from GaAs of the second conducting type (p-type) are sequentially formed on the semiconductor base body 1 by epitaxial growth using the known MOCVD (Metalorganic Chemical Vapor Deposition) process, to thus form a semiconductor substrate 6. In addition, a buffer layer made from GaAs or the like may be previously formed on the semiconductor base body 1 as needed (not shown).

Figure 1B:
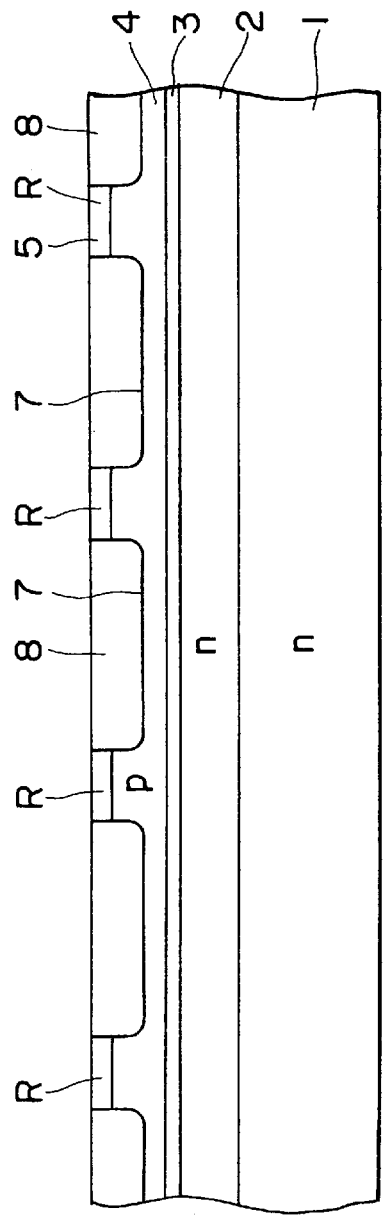

As shown in FIG. 1B, a plurality of ridge grooves 7 are formed in the semiconductor substrate 6 by etching, to form a plurality of ridge portions R arranged parallel to each other. Each of the ridge portions R is positioned between the two adjacent ridge grooves 7, and it has a width equivalent to a width of a light emitting region of a semiconductor laser to be formed.

Then, a film of GaAs of the first conducting type (n-type) is formed by epitaxial growth in such a manner that the ridge grooves 7 are buried with the n-type GaAs film, followed by planarization of the surface of the n-type GaAs film, to form current constriction layers 8 in the ridge grooves 7 and also to expose the cap layers 5 at the ridge portions R between the current constriction layers 8.

Figure 2:
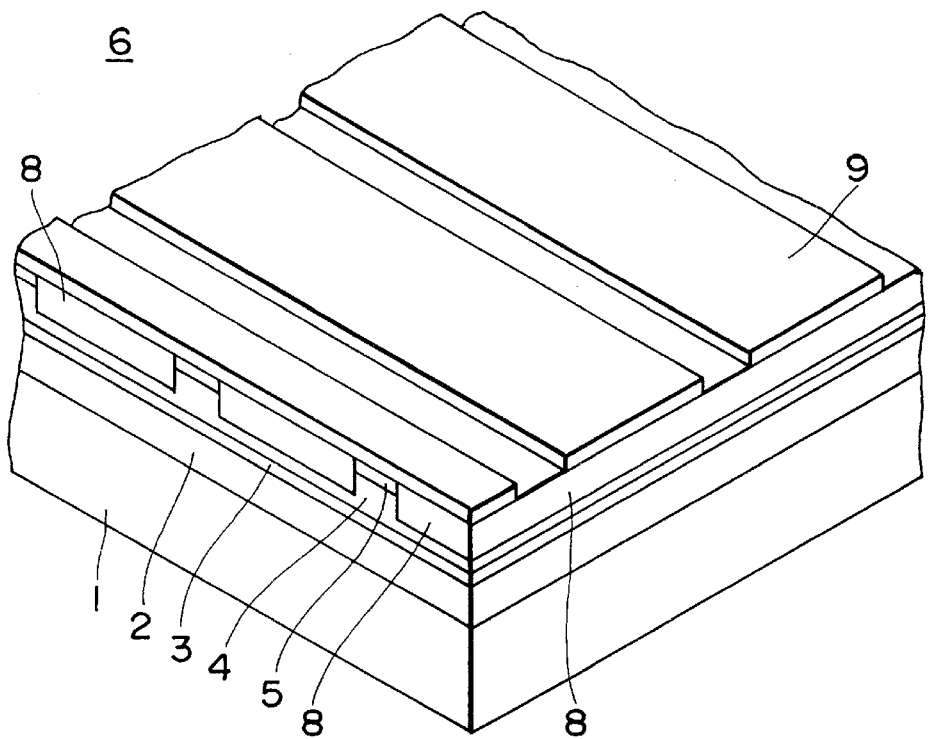
FIG. 2 is a perspective view illustrating additional steps for fabricating the semiconductor light emitting device according to the embodiment of the present invention.

Then, as shown in FIG. 2, a mask layer 9 is formed on the semiconductor substrate 6. The mask layer 9 is used at least as a mask for selective epitaxial growth (which will be described later) and it can be also used as a mask for grooving performed in a subsequent step. To be more specific, a plurality of stripes of the mask layer 9, each having a specific width, are formed in such a manner as to be parallel to each other at specific intervals and to extend in a crosswise direction across the light emitting regions of the devices to be formed, by forming a $SiO_2$ layer on the entire surface of the semiconductor substrate 6 by CVD or the like and patterning the $SiO_2$ layer into stripe shapes using photolithography and etching. The width of the single stripe of the mask layer 9 is selected at a value corresponding to a length of the optical resonator of the semiconductor device finally formed.

Figure 3:
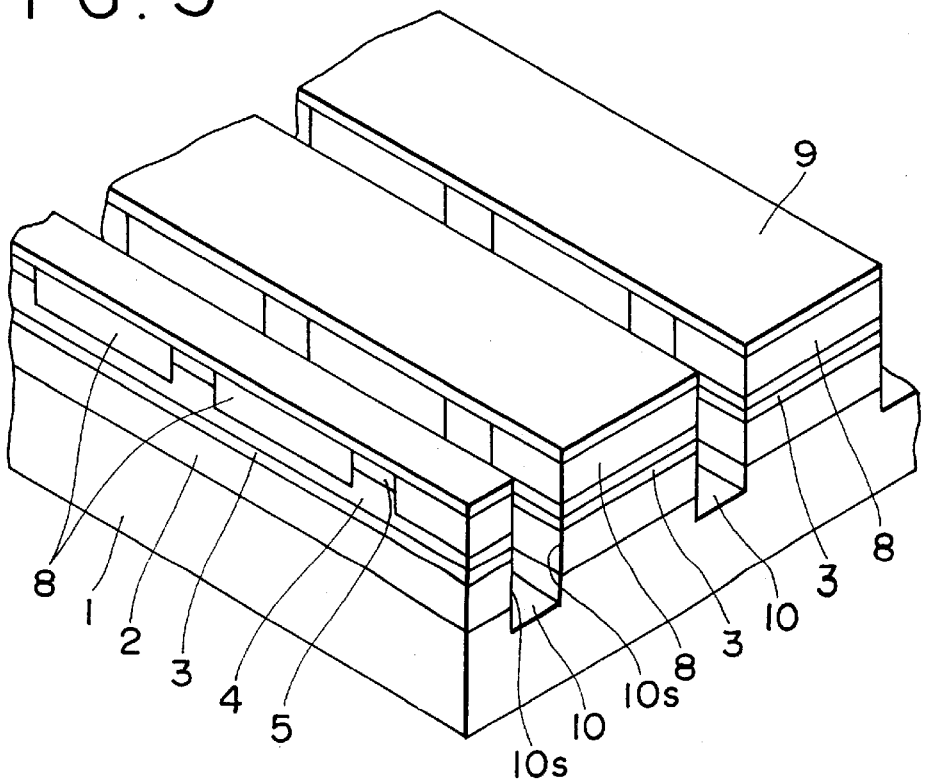
FIG. 3 is a perspective view illustrating additional steps for fabricating the semiconductor light emitting device according to the embodiment of the present invention.

As shown in FIG. 3, a stripe-like groove 10 having side surfaces 10s being substantially upright is formed between the two adjacent stripes of the mask layer 9 by anisotropically dry-etching or crystallographic-etching the semiconductor substrate 6 using the mask layer 9 as an etching mask. Specifically, the anisotropic etching is performed in the direction from the upper side of the epitaxially grown semiconductor layers, that is, from the side of the cap layer 5 to a depth at least lower than that of the active layer 3, for example, to a depth reaching the GaAs semiconductor base body 1. At this time, the extending direction of the stripe-like groove 10 is selected such that the side surface 10s is mainly formed of, for example, a (011) crystal plane which is lowest in epitaxial growth rate among crystal planes. To be more specific, assuming that the semiconductor base body 1, that is, the semiconductor substrate 6 has a (100) crystal plane, if both the side surfaces 10s of each groove 10 are intended to be mainly formed of (011) and (0-1-1) crystal planes respectively, the direction of the groove 10, that is, the direction of the stripes of the mask layer 9 may be selected at the direction along a [01-1] crystal axis.

Figure 4:
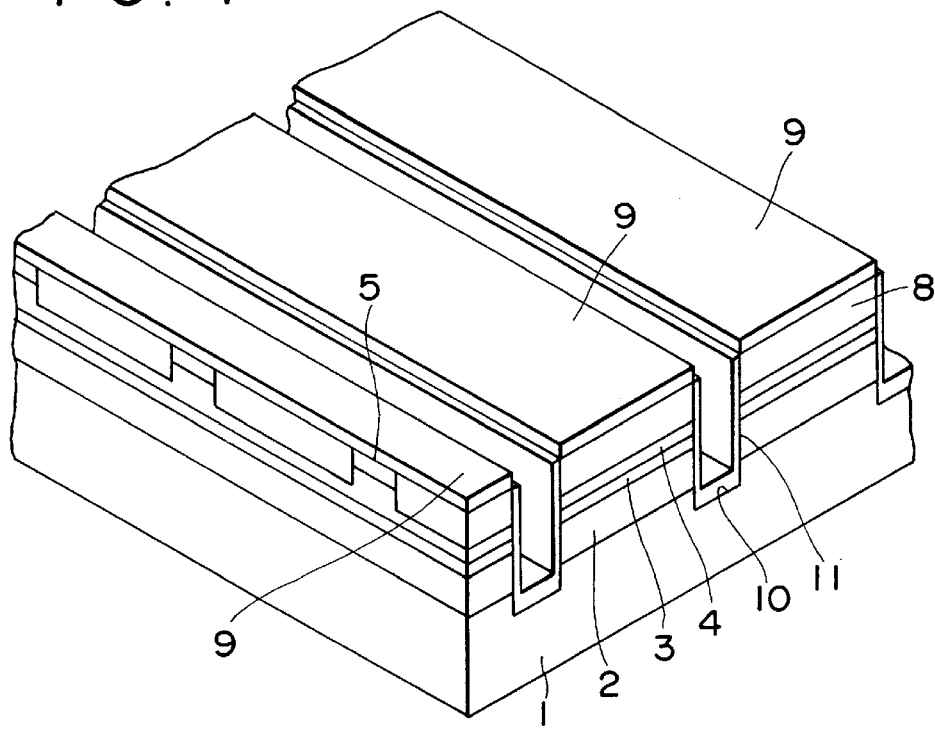
FIG. 4 is a perspective view illustrating a additional steps for fabricating the semiconductor light emitting device according to the embodiment of the present invention.

As shown in FIG. 4, a semiconductor film 11 made from $Al_zGa_{1-z}As$ ($z > x$) is formed by selective epitaxial growth using, for example, MOCVD with the mask layer 9 used as an epitaxial growth mask. In this process, since the growth rate is relatively large for a bottom surface of the stripe-like groove 10 mainly formed of the (100) crystal plane, the semiconductor film 11 is formed thick on the bottom surface; while since the side surfaces 10s of the stripe-like groove 10 are mainly formed of the (011) and (0-1-1) crystal planes respectively, the semiconductor film 11 grows very little on both side surfaces 10s. In this case, the side surfaces 10s, which are the etched surfaces, are not necessarily formed of only the (011) and (0-1-1) crystal planes, that is, the side surfaces 10s possibly contain other crystal planes to some extent, in addition to the (011) and (0-1-1) crystal planes. However, if the side surfaces 10s contain other crystal planes, the semiconductor film 11 is formed on the other crystal planes by epitaxial growth, and if the epitaxia:L growth involves generation of the (011) and (0-1-1) crystal planes, the epitaxial growth is almost stopped at the (011) and (0-1-1) crystal planes. As a result, the surfaces of the semiconductor film 11 formed on the side surfaces 10s become smooth surfaces at an atomic level depending on the (011) and (0-1-1) crystal planes. After that, while not shown, an optical film having a specific reflectance required for the end surface of the resonator is formed on the semiconductor film 11, as needed.

Figure 5:
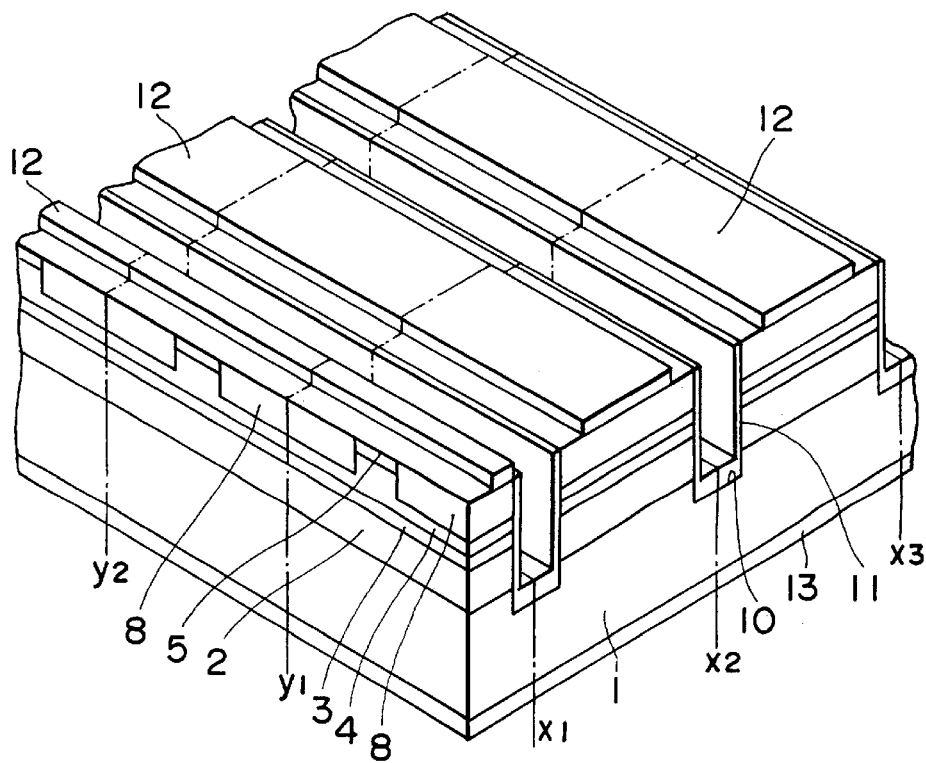
FIG. 5 is a perspective view illustrating further additional steps for fabricating the semiconductor light emitting device according to the embodiment of the present invention.

Then, as shown in FIG. 5, the mask layer 9 is removed by etching, and counter electrodes 12 and 13 of the semiconductor laser (which will be finally formed) are formed on both the top and bottom surfaces of the semiconductor substrate 6 so as to be in ohmic contact therewith. After that, the semiconductor substrate 6 is cut, that is, subjected to sizing, along planes indicated by chain lines $x_1$, $X_2$, $X_3$, ..., $x_n$ extending in the stripe-like grooves 10 and along planes indicated by chain lines $y_1$, $y_2$, $y_3$, ..., $y_n$ extending in the current constriction layers 8 perpendicularly to the chain lines $x_1$, $x_2$, $x_3$, ..., $X_n$.

Figure 6:
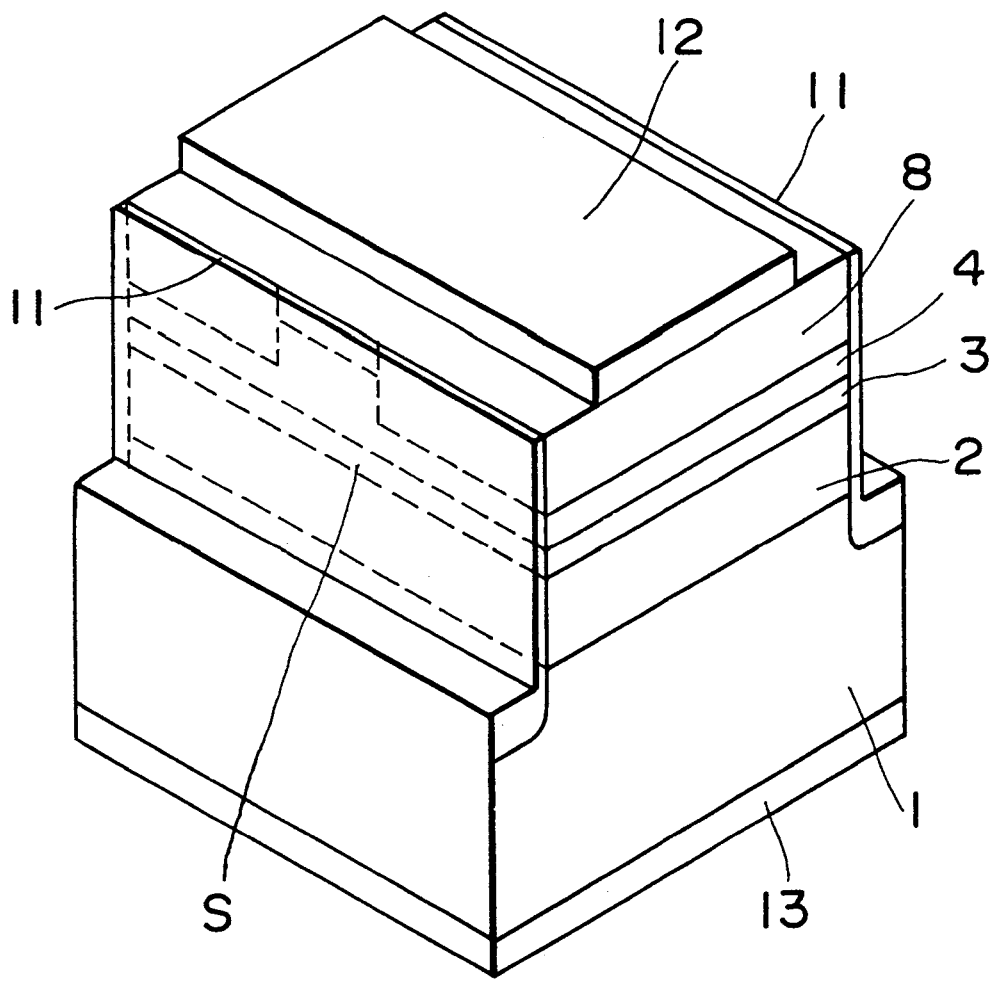
FIG. 6 is a perspective view of a semiconductor light emitting device obtained by the method of fabricating a semiconductor light emitting device of the present invention.

Thus, as shown in FIG. 6, a desired semiconductor laser, that is, semiconductor light emitting device is obtained, in which an end surface of a resonator, that is, a light emitting surface S is formed from the above smooth semiconductor film 11.

In the above embodiment, the first conducting type is taken as the n-type and the second conducting type is taken as the p-type; however, the first conducting type may be taken as the p-type and the second conducting type may be taken as the n-type. Further, the above embodiment is described using the structure in which the clad layers 2 and 3 are disposed adjacent to the active layer 3; however, the present invention can be applied to semiconductor light emitting devices having various structures, for example, a SCH (Separate Confinement Heterostructure) in which a guide layer is formed adjacent to the active layer 3, and a structure in which the current constriction layer 8 is composed of a high resistance layer doped with an impurity by ion implantation.

Further, while the above embodiment is described by example of fabrication of an AlGaAs based semiconductor light emitting device, the present invention can be applied to fabrication of a group III–V semiconductor light emitting device, a group II–VI semiconductor light emitting device, or the like.

What is claimed is:

1. A semiconductor light emitting device structure, comprising:

semiconductor layers, formed on a base body, to construct a plurality of semiconductor light emitting devices; grooves formed in said semiconductor layers, said grooves extending from a top surface of said semiconductor layers to said base body; and a semiconductor film formed in said grooves by epitaxial growth, wherein a crystal plane of a side surface of each of said grooves has a lower epitaxial growth rate than a crystal plane of a bottom surface of said groove, said side surface of each of said grooves forming an end surface of each of said semiconductor light emitting devices through which light is emitted.

2. The semiconductor light emitting device structure according to claim 1, wherein said crystal plane of said side surface of each of said grooves is a (110) crystal plane.

3. The semiconductor light emitting device structure according to claim 2, wherein a crystal plane of said bottom surface of each of said grooves is a (100) crystal plane.

4. The semiconductor light emitting device structure according to claim 1, wherein each of said semiconductor light emitting devices is an AlGaAs based semiconductor laser.

5. The semiconductor light emitting device structure according to claim 1, wherein each of said semiconductor light emitting devices is an AlGaInP based semiconductor laser.

6. The semiconductor light emitting device structure according to claim 1, wherein the end surface of the resonator of each of said semiconductor light emitting devices is a smooth surface at an atomic level.

* * * * *